Nov. 3, 1970 R. E. OBENHAUS ETAL 3,538,385

APPARATUS FOR PROTECTING SEMICONDUCTOR DEVICES

Filed July 8, 1968 2 Sheets-Sheet 1

Robert E. Obenhaus,
Lyle E. McBride, Jr.,
Inventors.
Koenig, Senniger,
Powers and Leavitt,
Attorneys.

APPARATUS FOR PROTECTING SEMICONDUCTOR DEVICES

Filed July 8, 1968 2 Sheets-Sheet 2

3,538,385
Patented Nov. 3, 1970

3,538,385

APPARATUS FOR PROTECTING SEMICONDUCTOR DEVICES

Robert E. Obenhaus, South Easton, and Lyle E. McBride, Jr., Norton, Mass., assignors to Texas Instruments Incorporated, Dallas, Tex., a corporation of Delaware Filed July 8, 1968, Ser. No. 743,155
Int. Cl. H02h 7/14
U.S. Cl. 317—33 19 Claims

ABSTRACT OF THE DISCLOSURE

The apparatus disclosed herein measures the instantanious temperature of gated semiconductor current switching devices by monitoring the gate current level required to turn on or render conductive the current switching device. If the level of gate current required falls below a preselected threshold, indicating overheating of the device, the device can be protected by deenergization before the gate circuit loses control of the device.

This invention relates to apparatus for protecting semiconductor devices and more particularly to such apparatus which will protect gated semiconductor current switching devices from loss of control by the gate circuit.

When semi-conductor current switching devices are employed in applications where the device is used nearly at its maximum rating or where the steady state maximum rating may be transitorily exceeded, it is important that the device itself be protected from damage through overheating and from the loss of gate control which may occur at junction temperatures above a predetermined level.

It has been found that the current required to turn on a gated semiconductor current switching device, such as a triac or SCR, decreases as junction temperature within the device increases. In fact, at some predetermined temperature level, the gate circuit loses all control over the conductivity of the device and the device will conduct whether or not any triggering current is applied to the gate circuit. In many control applications, such as motor starting circuits and the like, it is important that the device itself be protected or monitored not only to prevent damage to the device but also to prevent loss of control over the energization of an electrical load, such as a motor, being energized through the device.

Among the several objects of the present invention may be noted the provision of apparatus for measuring the junction temperature of a gated semiconductor device; the provision of such apparatus for protecting such a device from damage through overheating or from loss of control from overheating; the provision of such apparatus which will automatically deenergize such a device before damage or loss of control occurs; the provision of such apparatus which permits the device to be operated to the full extent of its current carrying capability; the provision of such apparatus which is reliable; and the provision of such apparatus which is relatively simple and inexpensive. Other objects and features will be in part apparent and in part pointed out hereinafter.

Briefly, apparatus according to this invention is operative to protect a gated semiconductor current switching device of the type having an anode power circuit and a gate circuit which controls conduction through the anode circuit. The apparatus includes means for applying a progressively increasing current to the gate circuit and obtaining from the device itself a signal which varies as a function of the gate circuit current required to produce conduction in the anode circuit. Means are controlled by the signal for deenergizing the device if the level of the gate circuit current required falls below a preselected threshold. Accordingly, the device is protected from loss of control by the gate circuit.

The invention accordingly comprises the constructions hereinafter described, the scope of the invention being indicated in the following claims.

In the accompanying drawings in which various possible embodiments of the invention are illustrated, FIG. 1 is a schematic circuit diagram of a triac conventionally connected for self-triggering operation;

Corresponding reference characters indicate corresponding parts throughout the several views of the drawings.

Figure 1:
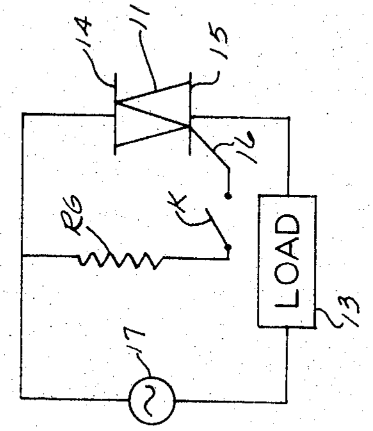

Referring now to FIG. 1, the circuit shown there is a simplified conventional arrangement for operating a triac 11 in a self-triggering mode to control the energization of a load 13. In this example, load 13 is assumed to be resistive in character. As is understood by those skilld in he art, triac 11 is a gated semiconductor current switching device which includes a pair of anodes 14 and 15 which constitute the terminals of the triac power circuit. The triac also includes a gate terminal 16 which, with the anode 15, constitutes a gate circuit which, under normal operation, controls conduction through the anode power circuit. The anode power circuit and the load 13 are connected in series across a source of A.C. power indicated generally at 17. Current is selectively supplied from the anode 14 of triac 11 to the gate terminal 16 through a resistor RG and a set of contacts K.

Figure 2:
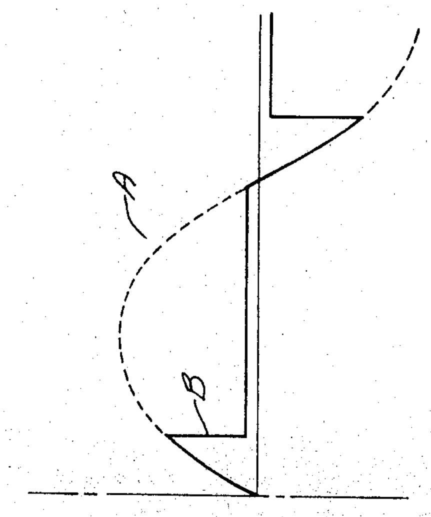
FIG. 2 is a graph illustrating the behavior of the voltage developed across the triac of FIG. 1 with respect to time.

When it is operating normally, triac 11 will block the flow of A.C. current to the load 13 when the contacts K are open and will conduct A.C. current to the load when the contacts K are closed, the triac being triggered or gated into conduction on each half cycle by current provided through the resistor RG. This gating operation may be further understood with reference to FIG. 2 in which curve A represents the A.C. supply voltage and curve B represents the voltage appearing across the anodes of the triac 11. When the supply voltage initially increases above the zero level, the current flowing through resistor RG is insufficient to gate the triac into conduction. Thus substantially the entire source voltage appears across the triac as is illustrated by the curve B following the sinusoidal supply waveform. As the voltage across the triac progressively increases, however, the current flowing through resistor RG also increases and finally a point is reached at which the current applied to the gate terminal 16 is sufficient to cause conduction through the anode circuit. At this point the votlage between the anode terminals drops to a very low saturation level and remains at this level throughout the remainder of the A.C. half cycle. When the A.C. supply voltage passes through zero level the triac ceases conducting and must be regated into conduction on the next half cycle. As is also understood by those skilled in the art, there is a slight delay in the switching mechanism of the triac and thus the anode voltage will reach a slightly higher level than that which is just necessary to produce the required triggering current through the resistors RG. However at normal supply frequencies, e.g., 60 cycles, this delay and the resultant increase in the anode voltage are insignificant.

As noted previously, the actual level of gate circuit current required to gate the triac into conduction will vary with temperature and at some relatively high temperature will in fact drop to zero level so that control by the gate circuit is lost. In other words, the anode circuit will then conduct whether or not external gating circuit is applied. In fact, a curve directly relating gate circuit current and junction temperature for a particular device can be obtained under steady-state conditions by externally heating the device to a plurality of uniform temperatures. According to the aspect of the invention, it has been found that a signal can be obtained from the anode circuit of the triac, which signal varies as a function of the gating current required to trigger the triac and hence also as a function of junction temperature under both transient and steady-state conditions.

As the gating current in the circuit of FIG. 1 is obtained from the anode 14, it can be seen that the gating current is applied in a progressively increasing manner until the required level of gating current is reached. Thus, as the value of gating current required to trigger the triac varies with junction temperature, the time at which conduction occurs and the value of anode voltage which is reached by that time will also vary in related fashion. Thus, when the triac is operated in a self-triggering mode, the value of the peak voltage developed across the anode circuit is representative of the gate current required to produce conduction through the anode circuit. As the saturation voltage across the anode circuit is relatively small and remains relatively constant, a convenient method of measuring the peak anode voltage is by means of the voltage pulse which occurs at the anode 14 when the triac switches into its conductive state.

Figure 3:
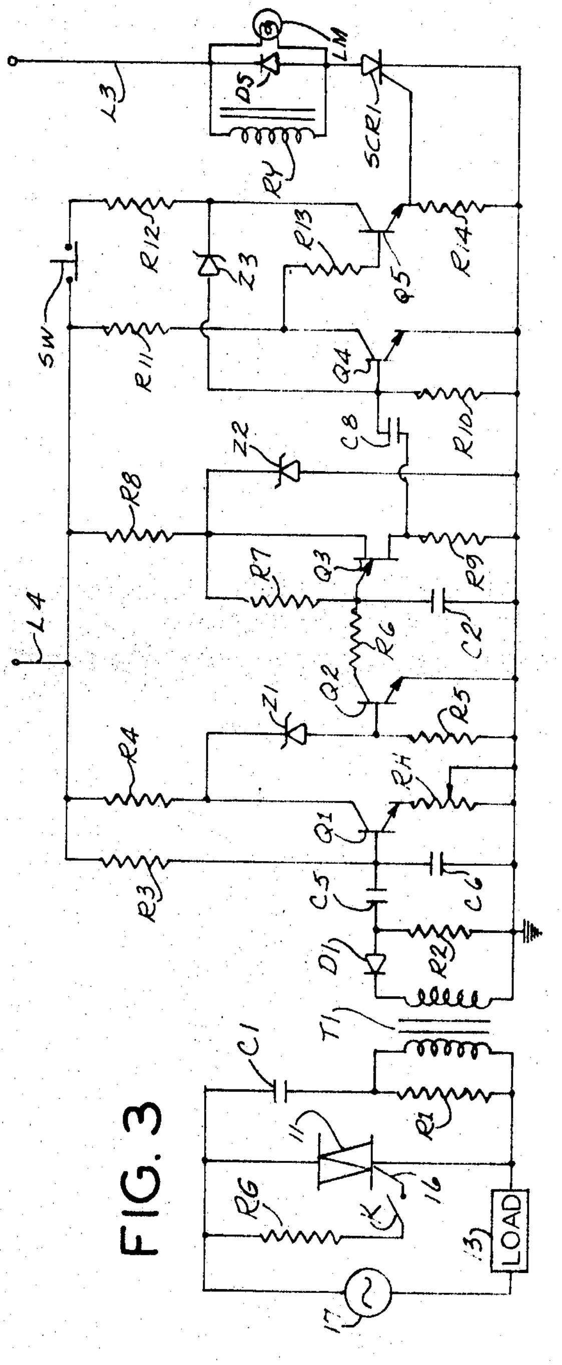
FIG. 3 is a schematic circuit diagram of apparatus of this invention for protecting a gated semiconductor current switching device.

The apparatus illustrated in FIG. 3 employs this pulse to automatically protect the triac from damage or loss of control through overheating. To provide a means for deenergizing the triac, the gate circuit contacts K are controlled by a relay winding RY, the contacts being closed when the winding is deenergized. The winding RY is in turn selectively energized from an A.C. supply lead L3 through a silicon controlled rectifier SCR1. The winding RY is shunted by a diode DS for suppressing inductive pulses and preventing chattering of the relay on those A.C. half cycles when the SCR is not forward biased. An indicator lamp LM connected across the relay winding is energized concurrently therewith.

The pulse signals generated across the anode circuit of triac 11 are coupled, through a high-pass filter comprising a capacitor C1 and a resistor R1, to the primary winding of a pulse transformer T1. The high-pass filter isolates and protects the transformer T1 from the A.C. supply voltage. This filter may also comprise the *dv/dt* suppression network conventionally provided with semiconductor switching devices of this type or a separate network may be provided. The pulses passed by the transformer T1 are rectified by a diode D1 so that only negative going components thereof are applied across a resistor R2.

The negative going pulses applied across resistor R2 are coupled, through a capacitive network comprising a pair of capacitors C5 and C6, to the base of an NPN transistor Q1 which amplifies and inverts this pulse signal. Transistor Q1 and the control circuitry described hereinafter are provided with direct current through a supply lead L4. Transistor Q1 is provided with a collector load resistor R4 and an emitter resistance constituted by a rheostat RH which permits the effective gain of transistor Q1 to be conveniently adjusted. Transistor Q1 is normally biased substantially to saturation by current provided through a resistor R3. Thus normally substantially the entire source voltage appears across the load collector load resistor R4.

The collector of transistor Q1 is coupled, through a silicon unilateral switch or Zener diode Z1, to the base of an NPN transistor Q2. Transistor Q2 is normally biased substantially to cutoff by a resistor R5. The emitter-collector circuit of transistor Q2 is connected, through a current limiting resistor R6, across a timing capacitor C2. Current for charging capacitor C2 at a predetermined rate is normally provided through a resistor R7.

Resistor R7 and capacitor C2 comprise portions of a timing circuit which also includes a unijunction transistor Q3. The base 1 terminal of transistor Q3 is connected to ground through a resistor R9 and its base 2 terminal is connected to the positive supply lead L4 through a resistor R8. The voltage across base 1-base 2 circuit is regulated by a Zener diode Z2. The emitter of unijunction transistor Q3 is connected to the junction between resistor R7 and capacitor C2. As is understood by those skilled in the art, unijunction transistor Q3 will fire if the voltage on capacitor C2 reaches a predetermined level which depends upon the intrinsic stand-off ratio of the transistor and upon the supply voltage. Upon firing, the unijunction transistor Q3 develops a voltage pulse across resistor R9.

Any pulse generated by unijunction transistor Q3 is coupled, through a capacitor C8, to the base of one (Q4) of a pair of NPN transistors Q4 and Q5 which are interconnected as a stabilized flip flop. The collector of transistor Q4 is connected to the supply lead L4 through a load resistor R11 and the collector of transistor Q5 is connected to that lead through a load resistor R12 and a reset switch SW. The transistor Q5 is provided with an emitter load ressitor R14. Cross coupling between the transistors to provide the bistable mode of operation is provided by a network comprising a Zener diode Z3 and a resistor R10 which couples the collector of transistor Q5 to the base of transistor Q4 and by a resistor R13 coupling the collector of transistor Q4 to the base of transistor Q5. As is understood by those skilled in the art, the flip flop circuit comprising transistors Q4 and Q5 is stable in either of two states. In a first one of these states the transistor Q5 conducts while the transistor Q4 is cut off and in a second state transistor Q4 conducts while transsitor Q5 is cut off. Because of the voltage drop provided by the Zener diode Z3, the transistor Q4 is forward biased only after the voltage at the collector of transistor Q5 reaches a relatively high voltage. Thus, when the circuit is initially energized, this flip flop circuit assumes its first state in which transistor Q5 conducts. The voltage developed across resistor R14 whenever transistor Q5 conducts is applied across the gate-cathode circuit of SCR1 to cause the SCR to energize the relay winding RY.

The operation of this control is substantially as follows. When the control is initially energized, the flop flop circuit comprising transistor Q4 and Q5 assumes its first state with transistor Q5 conducting as decribed previously. Thus, SCR1 and the relay winding RY are energized so that the contacts K are closed and a circuit is completed, through resistor RG, to the gate of triac 11 thereby causing it to function in a self-triggering mode. Simultaneously, the timing capacitor C2 begins to charge through resistor R7.

Each time the triac self-triggers, a pulse is produced as described previously, the pulse having an amplitude which varies as a function of the magnitude of the gate circuit current required to gate the triac into conduction. The negative going portions of the pulse transmitted through transformer T1 are coupled to the base of amplifying transistor Q1. If the amplified positive going pulse thereby produced at the collector of transistor Q1 is large enough to produce conduction through Zener diode Z1, transistor Q2 will in turn be driven into conduction. The Zener diode Z1 thus establishes an amplitude threshold which must be exceeded before transistor Q2 can be turned on. Thus, the pulse signal obtained from the triac 11 must exceed a corresponding predetermined amplitude threshold before transistor Q2 is turned on at all. The gain of transistor Q1 is adjusted so that the threshold established by Zener diode Z1 is exceeded by the amplitude of pulses generated by the triac 11 in normal operation but is not exceeded by those smaller pulses which are generated when the triac junction temperature has risen to a dangerous level where only a low level gate current is required to produce conduction.

If transistor Q2 is turned on by a pulse signal of sufficient amplitude to overcome the threshold set by Zener diode Z1, conduction through its emitter-collector circuit discharges capacitor C2 resetting the timing circuit. The charging rate of capacitor C2 is chosen, by selection of the value of resistor R7, so that the capacitor will not charge to the firing threshold of unijunction transistor Q3 within the normal interval between successive pulses coming from the triac 11. Thus, when the triac 11 is operating at normal temperatures and is providing an anode voltage pulse of substantial amplitude, the unijunction transistor Q3 will never be permitted to fire. If, on the other hand, the triac 11 heats to a point where loss of control by the gate circuit is imminent, the triac will trigger earlier in each cycle when the anode voltage is at a lower level thereby reducing the amplitude of the pulse signal which is generated upon firing of the triac. When the amplitude of the pulse signal falls below the level preselected by adjustment of the gain of transistor Q1 relative to the breakdown voltage of Zener diode Z1, the transistor Q2 will no longer be turned on by each pulse. The capacitor C2 will thus continue to charge without being discharged and will reach the triggering threshold of unijunction transistor Q3. When unijunction transistor Q3 fires, the pulse coupled to the base of transistor Q4 turns that transistor on thereby switching the flip flop circuit to the second of its stable states, transistor Q4 being maintained in conduction by current flowing through Zener diode Z3 and resistor R12. In this second state, transistor Q5 is cut off and thus no triggering voltage is supplied to the gate cathode circuit of SCR1. Accordingly, the relay winding RY is deenergized thereby deenergizing the triac 11 and the load whose energization is controlled by the triac. This deenergization or shut down occurs before the gate circuit loses control over the conductivity of the triac, and the extinguishing of lamp LM provides a visual indication of the temperature of the device, that is, that the temperature has exceeded the predetermined level.

This circuit can be reset to reenergize the triac 11 and its load by momenetarily opening the reset switch SW. Opening this switch removes the biasing current from Q4 allowing it to turn off thereby reapplying a forward bias, through resistor R13, to transistor Q5. Thus when the switch SW is then reclosed, the flip flop circuit resumes its first state with the transistor Q5 conducting so that SCR1 and the relay winding RY are energized to permit reenergization of the triac 11 and the load controlled thereby.

While in the embodiment illustrated, a progressively increasing gate circuit current is obtained from the anode of the protected semiconductor device and the anode circuit pulse is taken as a measure of gate circuit current required to produce conduction in the anode circuit, it will be apparent to those skilled in the art that other means of applying a progressively increasing gate circuit current may also be employed and that the point of time or level of current at which anode circuit conduction occurs can be determined in other ways, as by use of an oscilloscope, and still provide a useful indication of the junction temperature of the device and whether loss of control is imminent. It will also be apparent that, if desirable, an indicating light or an alarm signal can be energized when the amplitude of the pulse signal generated upon firing of the triac falls below the preselected level as explained supra.

Figure 4:
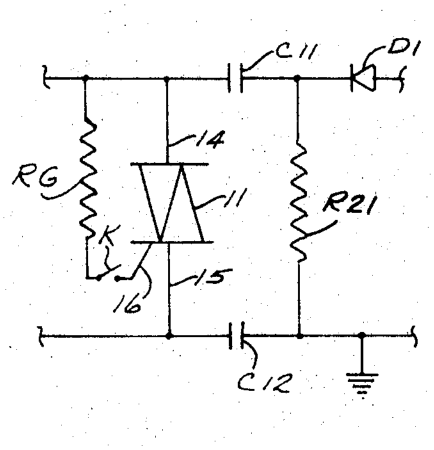
FIGS. 4 and 5 illustrate alternative embodiments of measuring circuits useful in the apparatus of FIG. 3.

As an alternative to employing a pulse transformer, the high-pass filter may comprise a pair of capacitors C11 and C12 and a resistor R21 as illustrated in FIG. 4. The pulse signal developed across resistor 21 may then be applied to the protection circuit through diode D1 just as the output pulse from the transformer T1 is in the circuit of FIG. 3.

When the load whose energization is being controlled by the triac 11 is inductive in character, e.g. an electric motor, it has been found that the rise and fall times of the anode circuit pulse may vary with varying loading and power factors. Thus if a high-pass filter such as those employed in the circuits of FIGS. 3 and 4, is utilized, these variations in rise and fall time may affect the amplitude of the transmitted pulse and obscure the effect which variations in gating circuit current produce. The sensing circuit shown in FIG. 5 minimizes these extraneous effects.

Figure 6:
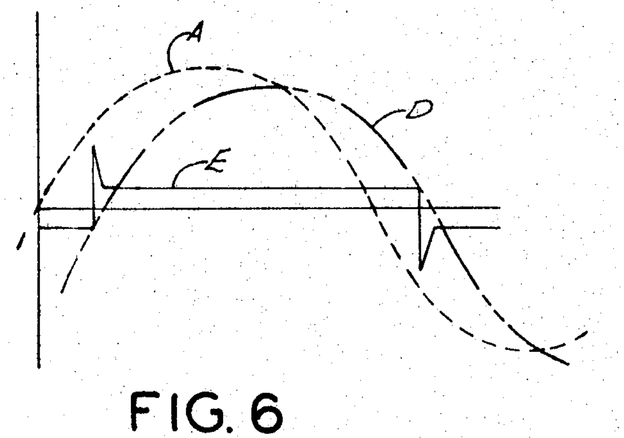
FIG. 6 is a graph representing the voltage developed across a gated semiconductor current switching device with respect to time when operated with an inductive load.

With an inductive load, the current through the load circuit tends to lag the applied voltage. This characteristic is illustrated in FIG. 6 in which curve A again represents the source voltage, curve D represents the current through the load circuit and curve E represents the voltage across the anode circuit. When the applied voltage passes through zero in either direction, the lagging current causes the triac to remain conductive in the previously existing direction. The triac remains conductive until the load circuit current drops substantially to zero level, i.e. below the so-called holding current level. As the inductively stored current is, at this point, completely dissipated and the triac is not conducting in either direction, substantially the entire source voltage tends to abruptly appear acrosss the anode circuit of the triac. As this substantially instantaneously applied voltage may already be of sufficient amplitude to immediately produce the required value of gate circuit current through resistor RG, the triac would immediately be turned on in the opposite direction if this voltage were applied directly to the gate circuit. The voltage pulse developed at turn-on would then be more a function of the lagging current rather than a function of the gating circuit current required or junction temperature.

Figure 5:
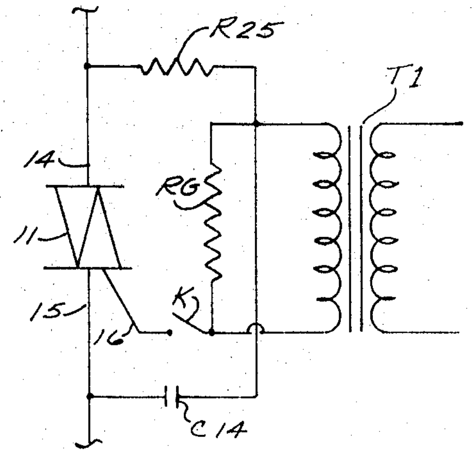

In order to avoid this substantially instantaneous application of a substantial voltage across the gating resistor RG, it has been found desirabale to employ a low-pass filter to slow the application of voltage to the gating resistor so that a progressively increasing gate circuit is obtained. Such a low-pass filter is shown in FIG. 5 and comprises a resistor R25 and a capacitor C14, gating current being taken through resistor RG from across the capacaitor. This filter circuit delays or slows the application of voltage across the resistor RG and thus causes the gate circuit current to increase relatively gradually. Accordingly, the time of triggering and the amplitude of the voltage developed across resistor RG will vary as a function of the gating current required and the junction temperature of the device will be substantially independeant of loading or load factor. The signal can thus be applied through transformer T1 to control a protective circuit substantially as illustrated in FIG. 3.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for protecting a gated semiconductor current switching device of the type having an anode power circuit and a gate circuit which controls conduction through said anode circuit, said apparatus comprising:
 means for applying a progressively increasing current to said gate circuit and obtaining from said device a signal which varies as a function of the gate circuit current required to produce conduction in said anode circuit; and
 means controlled by said signal for deenergizing said device if the level of gate circuit current required falls below a preselected threshold whereby said device is protected from loss of control by said gate circuit.

2. Apparatus as set forth in claim 1 wherein said means for applying an increasing current to said gate circuit includes resistive means for providing a gating current which varies as a function of anode circuit voltage.

3. Apparatus as set forth in claim 2 wherein said signal is obtained from said anode circuit.

4. Apparatus for protecting a gated semiconductor current switching device when said device is interconnected in an A.C. circuit for self-gating operation, said device being of the type having an anode power circuit and a gate circuit which controls conduction through said anode circuit, self-gating of said device being provided by current drawn from said anode circuit and applied to said gate circuit, the current applied to said gate circuit thereby being abruptly reduced when said anode circuit conducts, said apparatus comprising:
 means for obtaining from said device a pulse signal having an amplitude which varies as a function of the magnitude of the gate circuit current required to produce conduction in said anode circuit; and
 means for deenergizing said device if the amplitude of said pulse signal falls below a preselected threshold.

5. Apparatus as set forth in claim 4 wherein said means for obtaining a pulse signal includes a high-pass filter for obtaining a pulse signal from said anode power circuit when said anode circuit conducts.

6. Apparatus as set forth in claim 5 wherein said means for obtaining a pulse signal further includes a transformer for passing pulses obtained from said high-pass filter to said device deenergizing means.

7. Apparatus as set forth in claim 4 wherein said means for deenergizing said device includes threshold determining means for passing only pulses which exceed a preselected threshold.

8. Apparatus as set forth in claim 7 wherein said threshold determining means comprises a Zener diode.

9. Apparatus as set forth in claim 4 wherein said apparatus includes a low-pass filter for providing a progressively increasing voltage from said anode circuit and includes also a resistor energized from said progressively increasing voltage to apply a progressively increasing current to said gate circuit.

10. Apparatus as set forth in claim 9 wherein said signal is obtained from across said resistor.

11. Apparatus as set forth in claim 4 wherein said device deenergizing means includes timing means for delaying the deenergization of said device for a period longer than the interval between successive pulses in said pulse signal.

12. Apparatus for protecting a gated semiconductor current switching device when said device is interconnected in an A.C. circuit for self-gating operation, said device being of the type having an anode power circuit and a gate circuit which controls conduction through said anode circuit, self-gating of said device being provided by current drawn from said anode circuit and applied to said gate circuit, the current applied to said gate circuit thereby being abruptly reduced when said anode circuit conducts, said apparatus comprising:
 means for obtaining from said device a signal comprising a succession of pulses the amplitudes of which vary as a function of the magnitude of gate circuit current required to produce conduction in said anode circuit; and
 means for deenergizing said device if no pulse having an amplitude above a preselected threshold is obtained over a time interval of predetermined duration.

13. Apparatus as set forth in claim 12 wherein said means for deenergizing said device includes a timing circuit which is reset each time a pulse having an amplitude above said preselected threshold is obtained.

14. Apparatus as set forth in claim 13 wherein said timing circuit comprises a capacitor and means for charging said capacitor at a predetermined rate and means for deenergizing said device if the voltage of said capacitor reaches a predetermined level.

15. Apparatus as set forth in claim 14 wherein said means for deenergizing said device if the voltage on said capacitor exceeds a predetermined level includes a unijunction transistor which fires when the voltage on said capacitor reaches said preselected level.

16. Apparatus as set forth in claim 15 including a flip flop circuit having a first state in which said device is energized and a second state in which said device is deenergized and including means for switching said flip flop circuit to said second state when said unijunction transistor fires.

17. Apparatus for protecting a gated semiconductor current switching device when said device is interconnected in an A.C. circuit for self-gating operation, said device being of the type having an anode power circuit and a gate circuit which controls conduction through said anode circuit, self-gating of said device being provided by current drawn from said anode circuit and applied to said gate circuit, the current applied to said gate circuit, thereby being abruptly reduced when said anode circuit conducts, said apparatus comprising:
 a sensing circuit for obtaining from the anode circuit of said device a signal comprising a succession of pulses the amplitudes of which vary as a function of the magnitude of gate circuit current required to produce conduction in said anode circuit;
 a threshold determing circuit for determining which of said pulses exceeds a preselected amplitude threshold;
 a capacitor;
 means for charging said capacitor at a predetermined rate;
 means, controlled by said threshold determining circuit, for discharging said capacitor each time one of said pulses exceeds said preselected threshold; and
 means for cutting off the flow of gating current to said device when the charge on said capacitor reaches a predetermined level whereby said device is deenergized if no pulse having an amplitude above said preselected threshold is obtained over a time interval of predetermined duration.

18. Apparatus as set forth in claim 7 wherein said threshold determining means comprises a silicon unilateral switch.

19. Apparatus for measuring the instantaneous temperature, under transient and steady-state conditions, of a gated semiconductor current switching device of the type having an anode power circuit and a gate circuit which controls conduction through said anode circuit, said apparatus comprising;

means for applying a progressively increasing current to said gate circuit and obtaining from said device a signal which varies as a function of the gate circuit current required to produce conduction in said anode circuit; and means controlled by said signal for providing an indication of the temperature of the device.

References Cited

UNITED STATES PATENTS

| | | | |
|---|---|---|---|
| 3,365,675 | 1/1968 | Gaddy | 317—33 X |
| 3,372,304 | 3/1968 | Kuipers | 317—33 |
| 3,383,579 | 5/1968 | Han-Min Hung | 317—33 X |

J D MILLER, Primary Examiner

H. FENDELMAN, Assistant Examiner

U.S. Cl. X.R.

307—207, 305; 317—31, 36